United States Patent
Schinkel

(10) Patent No.: US 7,034,726 B2
(45) Date of Patent: Apr. 25, 2006

(54) DATA CONVERTER

(75) Inventor: Daniel Schinkel, Enschede (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 10/531,401

(22) PCT Filed: Sep. 22, 2003

(86) PCT No.: PCT/IB03/04220

§ 371 (c)(1),
(2), (4) Date: Apr. 14, 2005

(87) PCT Pub. No.: WO2004/036758

PCT Pub. Date: Apr. 29, 2004

(65) Prior Publication Data

US 2006/0001561 A1  Jan. 5, 2006

(30) Foreign Application Priority Data

Oct. 18, 2002 (EP) .................................. 02079337

(51) Int. Cl.
H03M 3/00 (2006.01)

(52) U.S. Cl. ...................................... 341/143; 341/155
(58) Field of Classification Search ................. 341/143
See application file for complete search history.

(56) References Cited

U.S. PATENT DOCUMENTS

| 5,834,987 A * | 11/1998 | Dent ........................... 332/127 |
| 6,064,871 A * | 5/2000 | Leung ......................... 455/323 |
| 6,411,244 B1 * | 6/2002 | Dobos et al. ................ 341/155 |
| 6,448,915 B1 * | 9/2002 | Logue ......................... 341/143 |
| 6,822,592 B1 * | 11/2004 | Gandolfi et al. ............. 341/143 |

* cited by examiner

Primary Examiner—Linh V. Nguyen
(74) Attorney, Agent, or Firm—Michael J. Ure

(57) ABSTRACT

A data converter comprises a discrete-time sigma delta modulator e.g. for driving a Class-D power amplifier. The low-pass filter of the sigma delta modulator is modified by adding a suitably positioned pole to lower the oscillation frequency (limit cycle) of the sigma delta modulator in order to obtain increased clustering of the pulses applied to the output of the data converter.

4 Claims, 2 Drawing Sheets

DATA CONVERTER

CROSS-REFERENCE TO RELATED APPLICATION

This application is a 371 of PCT/IB03/04220 filed on Sep. 22, 2003.

FIELD OF INVENTION AND RELATED ART

The invention relates to a data converter comprising a sigma delta modulator intended to operate at a specific sample frequency, said sigma delta modulator comprising in a feedback loop a comparator, a discrete-time low-pass filter and a quantizer in that order, in which the comparator is arranged to compare the output of the quantizer with the input signal to be converted. Such data converter is known from the article "Digital Power Amplification Using Sigma-Delta Modulation and Bit Flipping" by A. J. Margrath and M. B. Sandler in J. Audio Engineering Society, Vol. 45, No 6, pp 476–487, June 1997.

The invention is particularly but not exclusively of interest to driving switching power amplifiers (class D amplifiers). These amplifiers are used for instance in motor drivers, supply regulators and audio amplifiers. Conventional class D amplifiers use analog pulse width modulators. However, there is a need for digital pulse width modulators since nowadays signals are often available and processed in the digital domain. But the problem is, that digital pulse width modulators in which a direct translation of signal amplitudes into pulses with proportional width takes place, suffer from considerable signal distortion originating from the sampler. It is possible to reduce this distortion by using very high sample frequencies, however this has the drawback that quite complex and expensive circuits are required.

The approach followed in the above-mentioned article is to translate the digital PCM input signals into a pulse density modulated signal by means of a sigma delta modulator. Subsequently, the output pulses of the sigma delta modulator are used to switch the power amplifier, which operates as a 1-bit D/A converter, and the output of the power amplifier is applied to low-pass filtering means constituted wholly or partly by the load of the power amplifier. However, the problem with conventional sigma delta modulators is that the pulse density modulated signal has much higher switching frequencies than pulse width modulated signals. This limits their usability, especially in power converters, because the power losses in class D amplifiers increase proportional with the number of switching flanks. In the aforementioned article a method is proposed that uses a separate controller around the sigma delta modulator to force the sigma delta modulator to generate low frequency pulse patterns. This method is called "bit flipping" and it leads to quite promising results, but with the drawback of increased circuit complexity.

The present invention has for an object to force the sigma delta modulator to generate low-frequency pulse patterns with much lower circuit complexity than the solution of the said article, while there is a large flexibility in the choice of the average length of these pulse patterns and the data converter according to the present invention is therefore characterized in that, for decreasing the idle oscillation frequency of the sigma delta modulator, the discrete-time low-pass filter is arranged to have a 180° phase delay with positive group delay at a frequency that is at least four times lower than the sample frequency ($f_s$). The group delay is normally defined as the negative of the slope of the phase versus frequency characteristic. Therefore this means that according to the invention the phase versus frequency characteristic passes with increasing frequency downwardly through a 180° level at a frequency that is at least four times lower than the sample frequency (fs).

Theoretically, each sigma delta modulator generates an oscillation pattern, often called "limit cycle". An analog sigma delta modulator with a single integrator followed by a comparator would in theory start to oscillate at an infinite frequency and the average output signal would be equal to the input signal. An equivalent digital sigma delta modulator with zero input signal would start to oscillate around half the sample frequency because of the inherent time delay of the discrete-time integrator. The idea behind the present invention is that, by properly dimensioning the discrete-time low-pass filter, the sigma delta modulator may be forced to oscillate at a frequency which is substantially lower than is the case with prior art sigma delta modulators without "bit flipping" and that this reduction in oscillator frequency leads to broader pulse patterns and correspondingly lesser switching flanks in the output of the sigma delta modulator.

For instance, in a sigma delta modulator for audio signals with a standard CD-audio sample rate of 44.1 KHz which is firstly upsampled to a sample rate $f_s$ of 256×44.1 KHz, the average oscillation frequency may be reduced from $f_s/2=128 \times 44.1$ KHz to about 8×44.1 KHz, i.e. by a factor 16. The embodiment to be described afterwards in this application is based on these frequency-figures.

The most important advantage of a data converter according to the present invention is the much lower switching frequency with the corresponding reduction in energy dissipation, especially when the converter is used to drive a class D power amplifier. Moreover, the lower switching frequency makes the data converter of the present invention less sensitive to the most important problems associated with 1-bit converters, namely Inter Symbol Interference (ISI) and clock jitter. The average width of the pulses is much larger than for prior art 1-bit converters, thus the relative variance of the pulse-widths due to differences in the switching moments is smaller. Furthermore the switching frequency of the proposed data converter is more stable i.e. less dependent of the input signal, than the switching frequency of conventional data converters. Therefore the analog back-end behind the data converter of the present invention will generate less harmonic distortion. With the present invention most switching inaccuracies will lead to an increase of the noise floor and much less to an increase of the harmonic distortion.

SUMMARY OF THE INVENTION

A preferred embodiment of the data converter according to the present invention is characterized in that the transfer function of the discrete-time low-pass filter comprises, in its complex z-plane, a plurality of poles at or close to the point (1;0) of the unit circle of said plane and an additional pole on the positive real axis of said plane at a value between 0.20 and 0.92 for decreasing the idle oscillation frequency of the sigma delta modulator. Said plurality of poles may be positioned in known manner so that a suitable low frequency pass band, e.g. with Butterworth or Chebyshev characteristic, and a sufficiently steep roll off is obtained. These poles operate mainly in the baseband of the signals to be converted and substantially contribute to the noise shaping, i.e. the reduction of the noise power in said baseband. The additional pole on the real axis is mainly operative in the higher frequency band and determines the average frequency at which the loop will oscillate i.e. the average length of the pulse patterns. In the example given below this pole is positioned at the point (0.88;0) of the complex z-plane. Positioning the additional pole further away from the point (1;0) would increase the oscillator frequency, i.e. the more the additional pole is away from the point (1;0) the less influence the pole has on the pulse pattern. If it is desired to further decrease the oscillator frequency the pole has to be positioned closer to the point (1;0), however any further shift beyond approximately 0.92 would bring the pole too close to the point (1;0) and would cause the pole to lose any control over the oscillation pattern.

Preferably the DA-converter of the present invention is further characterized in that the transfer function of the discrete-time low-pass filter has a number of poles that exceeds the number of zeroes of said discrete-time low-pass filter by at least 2. Because usually in a digital sigma delta modulator the number of poles exceeds the number of zeroes by one, this means that the additional pole is introduced without the introduction of an additional zero. The position of the zeroes is a compromise between the stability requirements and the noise shaping requirements of the sigma delta modulator and this compromise is best preserved when the higher order characteristic at the lower frequencies is followed by a first order characteristic at the intermediate frequencies. By adding the additional pole without introducing an additional zero, a second order characteristic in the frequency range above said intermediate frequencies is obtained while the first order characteristic for the intermediate frequencies is preserved. However, in some cases, it is possible to place an additional zero somewhere on the real axis to change the phase characteristic of the filter and thereby the oscillation frequency, without a significant alteration of the noise shaping characteristics.

A suitable data converter according to the invention may be characterized in that the discrete-time low-pass filter comprises a cascade of integrators, summing means to sum the output of said integrators through coefficient multipliers to constitute the output of the discrete-time low-pass filter and a single order low-pass filter section arranged in series with the first of the integrators of said cascade for producing said additional pole on the real axis of the complex z-plane. The low-pass filter section may be placed either before or after the first of the integrators but, if the addition of a zero should be avoided, before the first tap to the summing means. It has to be remarked that alternatively the low-pass filter section may be placed in the output of the summing means. It may also be remarked that, without departing from the scope of the invention, some or all of the zeros may be made by feeding back the output of the quantizer to one or more points in the discrete-time low-pass filter.

It may further be observed that the data converter of the present invention is not restricted to converting digital PCM data to single-bit digital data, but may also be arranged to convert analog data to single-bit digital data. Such converter may e.g. comprise a single-bit D/A converter to convert the output of the quantizer to analog pulses for application to the (analog) comparator and a sampler to sample the analog output of the comparator and to supply the analog samples so obtained to the discrete-time low-pass filter.

BRIEF DESCRIPTION OF THE DRAWING

The invention will now be described with reference to the accompanying drawings. Herein.

DETAILED DESCRIPTION OF THE EMBODIMENTS

Figure 1:
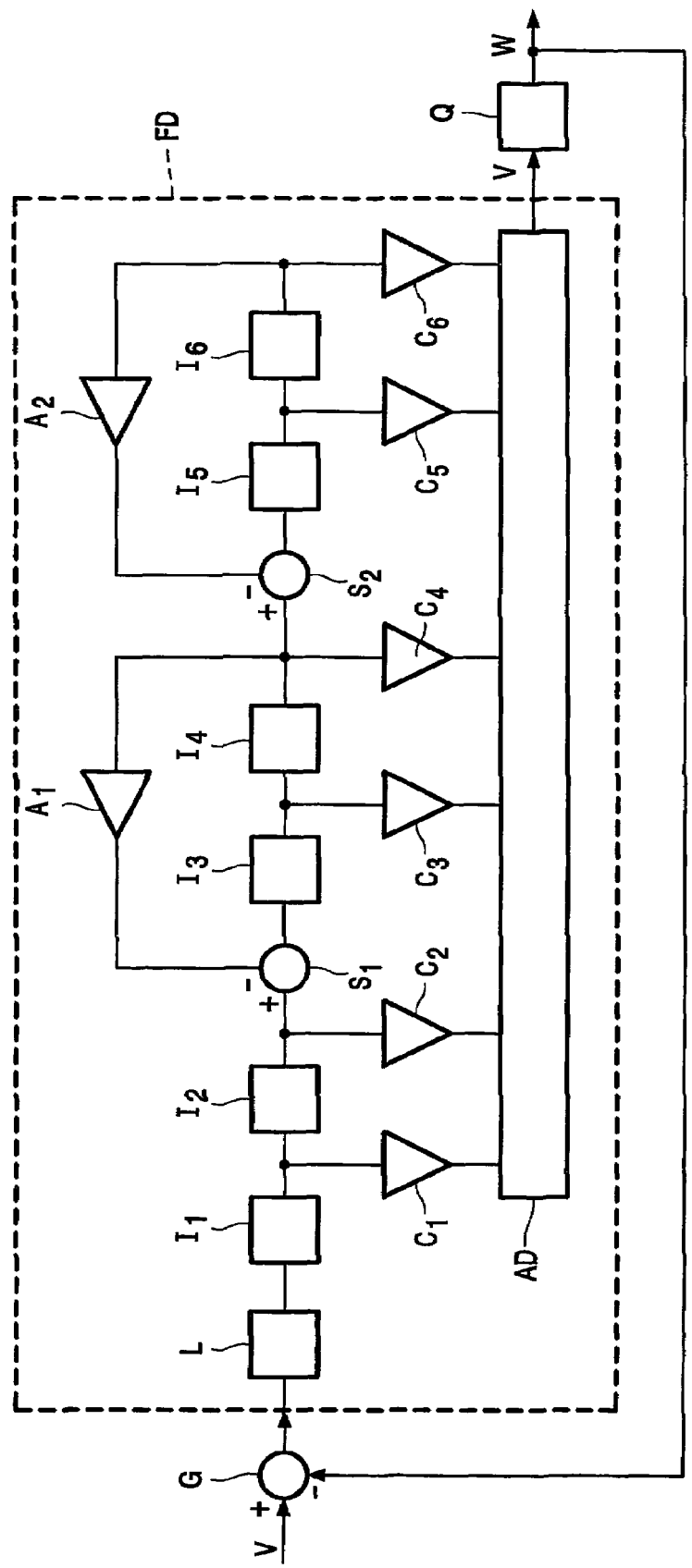
FIG. 1 shows a schematic diagram of an embodiment of a data converter according to the present invention.

The data converter of FIG. 1 comprises a digital low-pass filter FD that receives at its input terminal a digital input signal U, e.g. a digital PCM-signal, through a comparator G that might be a simple subtracter. The output signal V of the digital low-pass filter is quantized in a one-bit quantizer Q and the output W of the quantizer is fed back to the comparator G. Therefore, the comparator subtracts the quantizer output W from the input signal U, the difference signal U-W is passed to the digital low-pass filter FD and the low-frequency content of this difference signal U-W is applied to the quantizer. The output of the quantizer is a series of single-bit pulses, which may, with respect to a reference value, have either +1 or −1 value. The structure of comparator G, digital low-pass filter FD and quantizer Q constitutes a discrete-time sigma delta modulator which keeps the difference between the value of the PCM input signal and the low frequency content of the pulses W as small as possible. Therefore, when the input signal value increases, the number of +1 pulses in the output of the quantizer increases and the number of −1 pulses decreases. Equally, when the value of the input signal decreases, the number of +1 pulses in the quantizer-output decreases and the number of −1 pulses increases. Where the digital input signal U of the sigma delta modulator comprises bits whose value is dependent on the position of the bits, i.e. more significant bits and less significant bits, the digital output pulses W all have the same significance. In contrast to the digital input signal, the digital output signal of the sigma delta modulator has a low-frequency content which substantially matches the analog signal content and this analog signal content can therefore be recovered by a suitable single bit DA converter followed by an analog low-pass filter. In practice the single-bit DA converter may contain a switched power amplifier (class-D amplifier) and the analog low-pass filter may comprise one or more loudspeakers.

The total power of the output signal W of the sigma delta modulator is substantially higher than the power of the baseband signal, which means that a certain frequency band outside the signal band has to be used to distribute the remaining output power (the noise power). In order to sufficiently shape this noise power to the remaining frequency band, the digital low-pass filter of the sigma delta modulator has to be of sufficiently high order. In the arrangement of FIG. 1 the digital low-pass filter FD comprises six integrators $I_1$ to $I_6$ in cascade. Each of the integrators has a z-transfer $1/(z-1)$. The integrators $I_1$ and $I_2$ each constitute a pole in point (1;0) on the unit circle of the complex z-plane. The integrators $I_3$ and $I_4$ would also constitute two poles in point (1;0) however the output of the integrator $I_4$ is, through a multiplier $A_1$, subtracted from the input of integrator $I_3$ by means of a subtracter $S_1$ and this measure causes an upward shift of one of the two poles and a downward shift of the other of the two poles to obtain conjugate poles in the points $(1; \pm\text{sqrt}(A_1))$. In the same way the integrators $I_5$ and $I_6$ have a multiplier $A_2$ and a subtracter $S_2$ in the input lead to the integrator $I_5$ in order to create two conjugate poles in the points $(1; \pm\text{sqrt}(A_2))$.

The outputs of the six integrators $I_1$ to $I_6$ are each connected to a coefficient-multiplier $C_1$ to $C_6$ respectively and the outputs of these coefficient-multipliers are summed in a summer AD to constitute the output V of the digital low-pass filter FD. As is well known, this structure creates a number of zeros in the transfer function of the digital low-pass filter. The six coefficient-multipliers of FIG. 1 create five zeros whose positions in the complex z-plane may be chosen by proper choice of the coefficients $C_1$ to $C_6$. The six poles lie on or very close to the point (1;0) of the complex z-plane and are distributed such that they guarantee a sufficient signal-to-noise ratio over the entire pass band and a sufficiently steep edge in the transfer characteristic above the pass band. The five zeros are located to obtain optimal stability at high input signal values and optimal shaping of the sample noise in the higher frequency band.

The arrangement of FIG. 1 further comprises a low-pass filter section L positioned between the input terminal of the digital low-pass filter FD and the integrator $I_1$. The low-pass filter section L has a transfer function 1/(z−B) and may e.g. be implemented by an adder followed by a sample delay, with the output of the delay being fed back to the adder, through a multiplier having factor B. An integrator whose output is multiplied by 1−B and then subtracted from its input may also implement it. The low-pass filter section L generates an additional pole on the horizontal axis of the complex z-plane at position (B;0). The section L may also be positioned behind the integrator $I_1$, but preferably before the tap to coefficient-multiplier $C_1$, so that the section L does not create an additional zero. With the section L the low-pass filter FD is of $7^{th}$ order with seven poles and five zeros. The position of the poles and zeros of an arrangement tested in practice is listed in the following table:

|  | Real part | Imaginary part |
| --- | --- | --- |
| Pole 1 | 1 | 0 |
| Pole 2 | 1 | 0 |
| Pole 3 | 1 | 0.0107 |
| Pole 4 | 1 | −0.0107 |
| Pole 5 | 1 | 0.0075 |
| Pole 6 | 1 | −0.0075 |
| Pole 7 | 0.88 | 0 |
| Zero 1 | 0.9933 | 0.0198 |
| Zero 2 | 0.9933 | −0.0198 |
| Zero 3 | 0.9836 | 0.0121 |
| Zero 4 | 0.9836 | −0.0121 |
| Zero 5 | 0.9805 | 0 |

The integrators $I_3$, $I_4$ and the multiplier $A_1$ with coefficient A1=0.00011449 create the two conjugate poles 3 and 4. Equally the integrators $I_5$, $I_6$ and the multiplier $A_2$ with coefficient A2=0.00005625 create the two conjugate poles 5 and 6. Poles 1 and 2 are created by the integrators $I_1$ and $I_2$ respectively and pole 7 is created by the low-pass filter section L with B=0.88. It may be observed that the poles 1 to 6 are all located at or in the neighborhood of the point (1;0) of the complex z-plane. This means that these six poles have their main influence on the frequencies below $0.01*f_s/2$ i.e. the frequencies of and close to the audio base band. In contradistinction herewith the additional pole 7 is located substantially more remote from the point (1;0) and therefore its influence is mainly on the frequencies from $0.01*f_s/2$ to $1*f_s/2$. With $f_s=256*44.1$ KHz the six poles are mainly operative below 56;5 KHz while the pole 7 is mainly operative in the frequency region between 56.5 KHz and 5650 KHz. The five zeros are preferably located as far as possible remote from the point (1;0) in order to improve the noise shaping, however this is limited by the stability requirements. In the example given above the zeroes are located, so that the turnover point between the higher (sixth) order transfer and the lower (first) order transfer is at about 80 KHz.

From the locations of the poles 2 to 6 and the zeros 1 to 5 given above the coefficients $C_1$ to $C_6$ may be calculated. This can be done by first calculating the coefficients $C_5$ and $C_6$ at the locations of the poles 5 and 6, then calculating the coefficients $C_3$ and $C_4$ at the locations of the poles 3 and 4 with the calculated coefficients $C_5$ and $C_6$ and finally calculating the coefficient $C_2$ at the location of the pole 2 with the calculated coefficients $C_3$ to $C_6$. The result with the pole and zero locations given above is as follows:

| $C_1$ | $C_2$ | $C_3$ | $C_4$ | $C_5$ | $C_6$ |
| --- | --- | --- | --- | --- | --- |
| 1 | 0.0657 | 0.00202198 | 3.38701E−5 | 4.49308E−7 | 1.2107E−9 |

In practice the coefficients $C_1$ to $C_6$ and the coefficients $A_1$ and $A_2$ may preferably be transformed into versions that are powers of two or summations of powers of two, in order to reduce circuit complexity.

Figure 2:
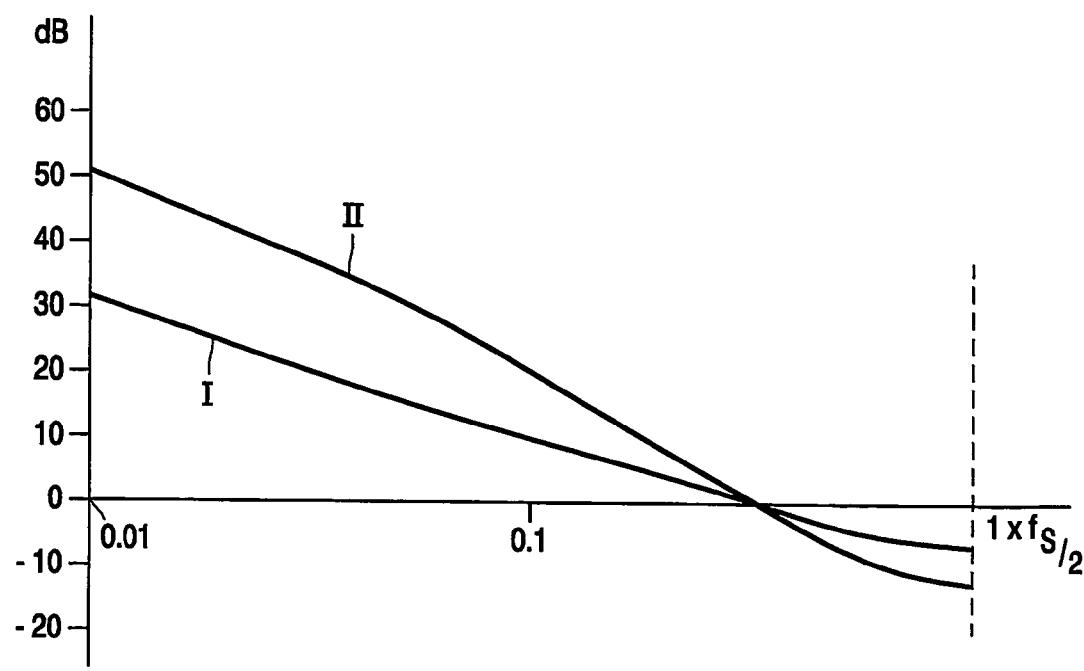
FIG. 2 shows amplitude versus frequency diagrams of the transfer function of the digital low-pass filter used in the embodiment of FIG. 2.
Figure 3:
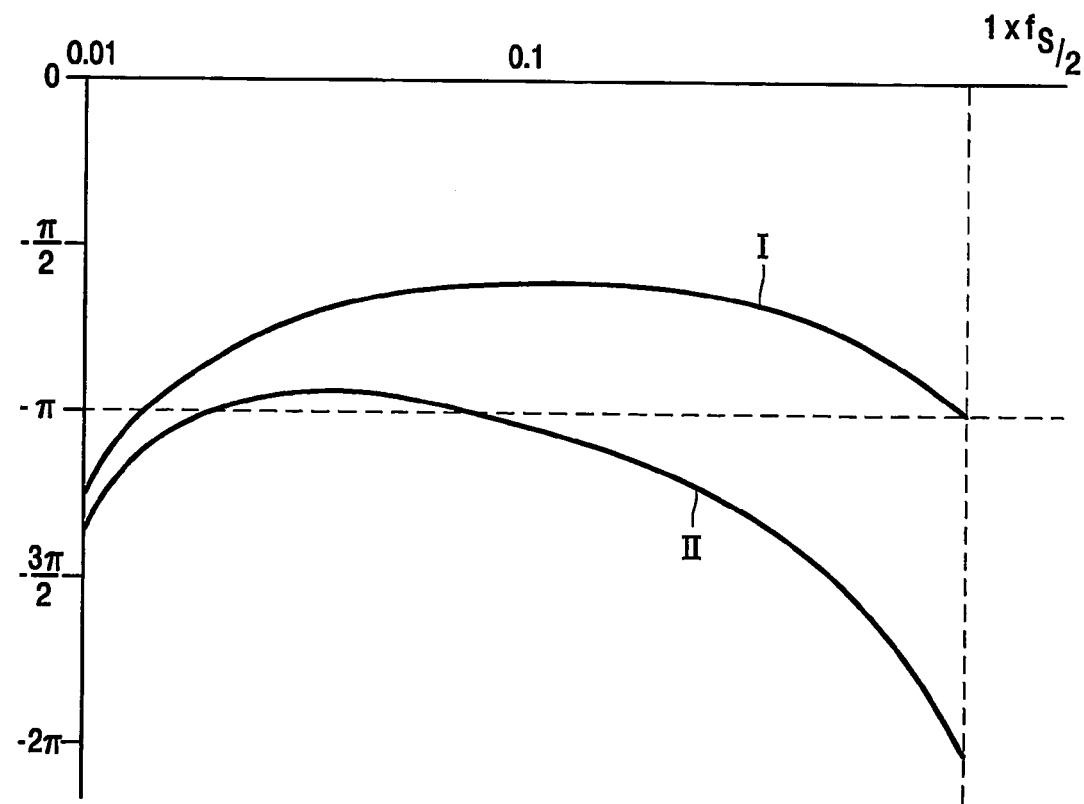
FIG. 3 shows phase versus frequency diagrams of the transfer function of the digital low-pass filter used in the embodiment of FIG. 2.

The function of the additional pole 7 may best be explained as follows. The sigma delta modulator feed back loop will always oscillate. Assume that the digital input signal U is zero during a large number of sample periods. Then, without the pole 7, the quantizer Q will output a sequence of alternating +1 and −1 pulses. In other words: the loop oscillates at a frequency $f_s/2=5650$ KHz. At other input signal levels the oscillating frequency will change in order to generate different pulse patterns such as e.g. +1, +1, −1, +1, +1, −1 etc. or +1, +1, +1, −1, −1, +1, +1, −1, −1. The function of the additional pole 7 is to lower the oscillation frequency i.e. to force the sigma delta modulator to generate longer pulse patterns. For instance the idle frequency, i.e. the oscillation frequency when the input signal value is zero, may be decreased to about $8*f_s=352.8$ KHz; this is a factor 16 lower than the original idle frequency. The pulse pattern at zero input signal value is then sixteen +1 pulses, sixteen −1 pulses, sixteen +1 pulses etc. and, because these pulses are NRZ, this means that the power amplifier driven by the data converter has to switch about sixteen 16 times less than without the additional pole 7. The effect of pole 7 may also be illustrated with the graphs of FIGS. 2 and 3 which show the amplitude-versus-frequency and the phase-versus-frequency characteristics of the transfer function of the digital low-pass filter FD with and without the pole 7 in the region between $0.01*f_s/2$ and $1*f_s/2$. The curves I represent these characteristics without the low-pass section L and the curves II represent these characteristics with the low-pass filter section L. From the phase-versus-frequency characteristics of FIG. 3 it may be seen that the curve I passes the −π(180°) level downwardly at $f_s/2$ while the curve II passes this level downwardly at a much lower frequency of about $0.07*f_s/2$.

It may be noted that the poles and zeros given above are of the digital low-pass filter FD. More relevant for the oscillatory behavior of the sigma delta modulator are the poles of the closed sigma delta loop itself. However, the quantizer in this loop is highly non-linear, which makes such analysis difficult. An approximation of the oscillatory behavior of the loop may be obtained by considering the quantizer Q as a sampling-noise source and an amplifier with signal-dependent amplification factor. Then the poles of the closed loop shift from the poles of the low-pass filter (with a low amplification factor) either to the zeros of the low-pass filter or to outside the unit circle of the z-plane (with a high amplification factor). Then the sigma-delta modulator will oscillate at approximately the frequency corresponding with the intersection of the trajectory of such shifting pole with the unit circle. Such trajectory, usually called the "root locus", may be established and analyzed with for example the ©MatLab tool.

The invention claimed is:

1. A data converter comprising a sigma delta modulator intended to operate at a specific sample frequency said sigma delta modulator comprising in a feedback loop a comparators, a discrete-time low-pass filter and a quantizer in that order, in which the comparator is arranged to compare the output of the quantizer with the input signal to be converted, characterized in that, for decreasing the idle oscillation frequency of the sigma delta modulator, the discrete-time low-pass filter is arranged to have a 180° phase delay with positive group delay at a frequency that is at least four times lower than the sample frequency.

2. The data converter as claimed in claim 1 characterized in that the transfer function of the discrete-time low-pass filter comprises, in its complex z-plane, a plurality of poles at or close to the point of the unit circle of said plane and an additional pole on the positive real axis of said plane at a value between 0.20 and 0.92 for decreasing the idle oscillation frequency of the sigma delta modulator.

3. The data converter as claimed in claim 2 characterized in that the transfer function of the discrete-time low-pass filter has a number of poles that exceeds the number of zeros of said discrete-time low-pass filter by at least 2.

4. The data converter as claimed in claim 3 characterized in that the discrete-time low-pass filter comprises a cascade of integrators, summing means to sum the output of said integrators through coefficient multipliers to constitute the output of the discrete-time low-pass filter and a single order low-pass filter section positioned in series with the first of the integrators of said cascade for producing said additional pole on the real axis of the complex z-plane.

* * * * *